United States Patent
Ilani (10) Patent No.: US 7,509,563 B2
(45) Date of Patent: Mar. 24, 2009

(54) FLEXIBLE FORWARD ERROR CORRECTION

(75) Inventor: Ishai Ilani, Modiin (IL)

(73) Assignee: Actelis Networks (Israel) Ltd., Petach Tikva (IL)

( * ) Notice: Subject to any disclaimer, the term of this patent is extended or adjusted under 35 U.S.C. 154(b) by 310 days.

(21) Appl. No.: 10/513,406

(22) PCT Filed: May 6, 2003

(86) PCT No.: PCT/IL03/00368

§ 371 (c)(1),
(2), (4) Date: May 19, 2005

(87) PCT Pub. No.: WO03/094357

PCT Pub. Date: Nov. 13, 2003

(65) Prior Publication Data

US 2005/0251723 A1    Nov. 10, 2005

Related U.S. Application Data

(60) Provisional application No. 60/377,619, filed on May 6, 2002.

(51) Int. Cl.
*H03M 13/00* (2006.01)

(52) U.S. Cl. ..................................... 714/779; 714/784

(58) Field of Classification Search .................. 714/779, 714/784
See application file for complete search history.

(56) References Cited

U.S. PATENT DOCUMENTS 6,000,053 A * 12/1999 Levine et al. ............... 714/766
7,149,811 B2 * 12/2006 Wise et al. .................. 709/247

FOREIGN PATENT DOCUMENTS

| GB | 2253974 | 9/1992 |
| WO | WO 96/19055 | 6/1996 |
| WO | WO 97/38495 | 10/1997 |

* cited by examiner

*Primary Examiner*—Guy J Lamarre
(74) *Attorney, Agent, or Firm*—Pearl Cohen Zedek Latzer, LLP (57) ABSTRACT

A forward error correction method including inserting at least one filler symbol into an input data stream at a pre-determined position, thereby generating a precoded symbol group, FEC encoding the precoded symbol group, thereby generating a code word, removing at least one of the filler symbols from the code word, thereby generating an optimized code word, inserting at least one filler symbol into the optimized code word at the predetermined position, thereby generating a deoptimized code word, FEC decoding the deoptimized code word, thereby generating a decoded symbol group, and removing at least one of the filler symbols from the decoded symbol group, thereby generating an output data stream.

18 Claims, 4 Drawing Sheets

FLEXIBLE FORWARD ERROR CORRECTION

CROSS-REFERENCE TO RELATED APPLICATIONS

This application is a U.S. National Phase Application under 35 U.S.C. 371 of PCT International Application No. PCT/IL2003/000368, which has an international filing date of May 6, 2003, and which claims priority from U.S. Provisional Patent Application No. 60/377,619, filed May 6, 2002.

FIELD OF THE INVENTION

The present invention relates to data telecommunications in general, and more particularly to forward error correction therefor.

BACKGROUND OF THE INVENTION

The use of Forward Error Correction (FEC) techniques in the design of digital communications and storage systems is well known. FEC is used to find and correct limited errors caused by a transport or storage system in order to ensure the validity of the received message without requiring retransmissions. In general, FEC encoding techniques, such as Reed-Solomon (RS) encoding, provide data redundancy by adding extra code symbols to a transmitted message which provide the necessary detection and correction information. The number of redundant symbols is determined by the amount and type of error correction required. RS encoding is an example of a block code where the data to be transmitted are divided into blocks, with each block comprising k symbols of data. An additional r redundancy symbols are then added to each block of k data symbols to form a code word of length $n=k+r$. The "code rate" of the code refers to the ratio $k/n$, and is used to express the average amount of data symbols versus the amount of transmitted symbols. Thus, a code rate of 0.8 would indicate that the average over all time intervals T of the ratio of data symbols that were encoded in time interval T to the total number of transmitted symbols in time interval T, is 80%.

In general, the additional redundancy symbols must contain enough information to allow the position of an erroneous information symbol to be located and its value determined. For example, an RS decoder can detect and correct up to $r/2$ incorrect symbols if there are $(r=n-k)$ redundant symbols in each code word, as one redundant symbol is used to detect and locate each error, and one more redundant symbol is used to identify the precise value of that error. Some symbols that are either known or suspected to be in error or otherwise unreliable may be labeled as "erasures." The position of each erasure may be provided in advance to the decoder which then ignores the actual value of the erasure and instead reconstructs its value using the redundancy symbols. Since the position of each erasure is known, only one redundant symbol is needed to reconstruct the value of an erasure, and an additional redundant symbol to determine the location of the erasure is not required. In general, if a code word contains E symbols that are erasures whose locations are known and e symbols that are errors with unknown locations, the code word can be correctly decoded provided that $(2e+E) \leq r$. If the locations of all the errors are known to the decoder, the message can be correctly decoded provided that $E \leq r$, thus requiring half the number of redundant symbols needed to correct errors whose locations are not known.

While conventional FEC techniques may be used successfully to correct errors, FEC encoders/decoders generally must be designed in advance with a predetermined ratio of information symbols to redundancy symbols according to the expected quality of the channel over which the data is transmitted. Thus, in order for a single FEC encoder or decoder to be used for multiple data channels of varying quality, a conventional FEC encoder or decoder will either have to be configured to provide sufficient redundancy for the channel with the poorest expected quality, or will have to be continually reconfigured according to the expected quality of the data of each channel to be encoded or decoded. Alternatively, several encoders and decoders may be implemented in parallel, with one encoder and decoder for each channel.

A FEC technique that can accommodate multiple streams of data of varying quality using a single FEC configuration that provides different levels of redundancy would therefore be advantageous.

SUMMARY OF THE INVENTION

The present invention seeks to provide a FEC technique whereby a single FEC encoder and/or decoder is employed for correcting errors in multiple communications channels using a different code rate for each channel according to its expected level of quality.

The present invention is particularly advantageous in communication channels related to xDSL technologies. Typically, an xDSL channel has a bandwidth of 1-50 Mbps depending on the particular channel length and the specific xDSL technology, while typical FEC encoders and decoders have much larger bandwidths. At the Central Office many modems are collocated, serve multiple users, and may have different bit rates and different coding configurations. Moreover, the xDSL chips designed for the Central Office typically include multiple modems on one chip, and would benefit were all the modems on the chip to share a single FEC encoder/decoder using the arrangement of the present invention. The present invention is believed to be superior to systems that employ a single configurable FEC device, since the FEC device of the present invention works at a constant rate and with code words of equal length.

Furthermore, the total bandwidth available to a system that employs the present invention is believed to be higher than that of a system based on a configurable FEC, as a configurable FEC device requires time to switch between FEC parameter changes. If the FEC parameter changes are to be made on a periodic basis, as is the case in a multi-line communications channel with different codes for each channel, then the benefit of the extra bandwidth provided by a configurable FEC device is believed to be negated by the cost of the time wasted for FEC parameter changes.

In one aspect of the present invention a forward error correction encoding system is provided including a FIFO buffer operative to provide data symbols received from a data stream, a filling buffer operative to provide filler symbols, a selector operative to choose either of data symbols from the FIFO buffer and filler symbols from the filling buffer and form a symbol group therefrom, a FEC encoder operative to encode the symbol group into a code word having at least one redundancy symbol, and an optimizer operative to remove from the code word any of the filler symbols.

In another aspect of the present invention the selector is operative to form a plurality of symbol groups of equal lengths, where at least two of the symbol groups have a different number of data symbols.

In another aspect of the present invention each of the FEC encoders is operative to receive a plurality of symbol groups of equal lengths, where at least two of the symbol groups have a different number of data symbols, and encode the plurality of symbol groups into a corresponding plurality of code words of equal length using a single code, each of the code words having an equal number of redundancy symbols.

In another aspect of the present invention the filling symbols are zeros.

In another aspect of the present invention the selector is operative to construct the symbol group of a predefined length z by selecting x of the data symbols in accordance with a predefined data symbol transmission rate and inserting y=z−x of the filler symbols.

In another aspect of the present invention the selector is operative to append the selected filler symbols to the selected data symbols.

In another aspect of the present invention the selector is operative to prepend the selected filler symbols to the selected data symbols.

In another aspect of the present invention the FEC encoder includes a systematic Reed-Solomon (RS) encoder.

In another aspect of the present invention the optimizer is operative to remove a different number of filler symbols from each of a plurality of the code words.

In another aspect of the present invention the optimizer is operative to remove any of the filler symbols whose locations are indicated by the selector.

In another aspect of the present invention the optimizer is operative to remove any of the redundancy symbols from the code word.

In another aspect of the present invention the optimizer is operative to remove a different number of redundancy symbols from each of a plurality of the code words.

In another aspect of the present invention a forward error correction decoding system is provided including a FIFO buffer operative to provide data symbols received from a data stream, a filling buffer operative to provide filling symbols, a selector operative to choose either of data symbols from the FIFO buffer and filler symbols from the fling buffer and form a symbol group therefrom, a FEC decoder operative to decode the symbol group into a decoded symbol group, and a filler remover operative to remove from the decoded symbol group any of the filler symbols.

In another aspect of the present invention the selector is operative to form a plurality of symbol groups of equal lengths, where at least two of the symbol groups have a different number of data symbols.

In another aspect of the present invention each of the FEC decoders is operative to receive a plurality of symbol groups of equal lengths, where at least two of the symbol groups have a different number of data symbols.

In another aspect of the present invention the filling symbols are zeros.

In another aspect of the present invention the selector is operative to construct the symbol group of a predefined length z by selecting x of the data symbols in accordance with a predefined data symbol transmission rate and inserting y=z−x of the filler symbols.

In another aspect of the present invention the selector is operative to append the selected filler symbols to the selected data symbols.

In another aspect of the present invention the selector is operative to prepend the selected filler symbols to the selected data symbols.

In another aspect of the present invention the selector is operative to select for inclusion in the symbol group a number of the filler symbols corresponding to a number of filler symbols previously removed from the data stream.

In another aspect of the present invention the selector is operative to select for inclusion in the symbol group a number of the filler symbols corresponding to a number of redundancy symbols previously removed from the data stream.

In another aspect of the present invention the FEC decoder includes a systematic Reed-Solomon (RS) decoder.

In another aspect of the present invention the filler remover is operative to remove a different number of filler symbols each of a plurality of the decoded symbol groups.

In another aspect of the present invention the filler remover is operative to remove any of the filler symbols whose locations are indicated by the selector.

In another aspect of the present invention the system further includes an erasure element operative to designate any of the data symbols as erasures.

In another aspect of the present invention a forward error correction encoding and decoding system is provided including an encoder including a first FIFO buffer operative to provide data symbols received from a data stream, a first filling buffer operative to provide filler symbols, a first selector operative to choose either of data symbols from the FIFO buffer and filler symbols from the filling buffer and form a first symbol group therefrom, a FEC encoder operative to encode the first symbol group into a code word having at least one redundancy symbol, and an optimizer operative to remove from the code word any of the filler symbols, and a decoder including a second FIFO buffer operative to provide data symbols received from the encoder, a second filling buffer operative to provide filling symbols, a second selector operative to choose either of data symbols from the second FIFO buffer and filler symbols from the second filling buffer and form a second symbol group therefrom, a FEC decoder operative to decode the second symbol group into a decoded symbol group, and a filler remover operative to remove from the decoded symbol group any of the filler symbols.

In another aspect of the present invention either of the selectors is operative to form a plurality of symbol groups of equal lengths, where at least two of the symbol groups have a different number of data symbols.

In another aspect of the present invention each of the FEC encoders is operative to receive a plurality of first selector symbol groups of equal lengths, where at least two of the symbol groups have a different number of data symbols, and encode the plurality of symbol groups into a corresponding plurality of code words of equal length using a single code, each of the code words having an equal number of redundancy symbols.

In another aspect of the present invention the filling symbols are zeros.

In another aspect of the present invention either of the selectors is operative to construct the symbol group of a predefined length z by selecting x of the data symbols in accordance with a predefined data symbol transmission rate and inserting y=z−x of the filler symbols.

In another aspect of the present invention either of the selectors is operative to append the selected filler symbols to the selected data symbols.

In another aspect of the present invention either of the selectors is operative to prepend the selected filler symbols to the selected data symbols.

In another aspect of the present invention the FEC encoder includes a systematic Reed-Solomon (RS) encoder.

In another aspect of the present invention the optimizer is operative to remove a different number of filler symbols from each of a plurality of the code words.

In another aspect of the present invention the optimizer is operative to remove any of the filler symbols whose locations are indicated by the selector.

In another aspect of the present invention the optimizer is operative to remove any of the redundancy symbols from the code word.

In another aspect of the present invention the optimizer is operative to remove a different number of redundancy symbols from each of a plural of the code words.

In another aspect of the present invention each of the FEC decoders is operative to receive a plurality of symbol groups of equal lengths, where at least two of the symbol groups have a different number of data symbols.

In another aspect of the present invention the second selector is operative to select for inclusion in the symbol group a number of the filler symbols corresponding to a number of filler symbols previously removed from the data stream.

In another aspect of the present invention the second selector is operative to select for inclusion in the symbol group a number of the filler symbols corresponding to a number of redundancy symbols previously removed from the data stream.

In another aspect of the present invention the FEC decoder includes a systematic Reed-Solomon (RS) decoder.

In another aspect of the present invention the filler remover is operative to remove a different number of filler symbols each of a plurality of the decoded symbol groups.

In another aspect of the present invention the filler remover is operative to remove any of the filler symbols whose locations are indicated by the selector.

In another aspect of the present invention the system further includes an erasure element operative to designate any of the data symbols as erasures.

In another aspect of the present invention a forward error correction encoding method is provided including choosing either of data symbols from a data stream and filler symbols, thereby forming a symbol group therefrom, encoding the symbol group into a code word having at least one redundancy symbol, and removing from the code word any of the filler symbols.

In another aspect of the present invention the choosing step includes forming a plurality of symbol groups of equal lengths, where at least two of the symbol groups have a different number of data symbols.

In another aspect of the present invention the encoding step includes receiving a plurality of symbol groups of equal lengths, where at least two of the symbol groups have a different number of data symbols, and encoding the plurality of symbol groups into a corresponding plurality of code words of equal length using a single code, each of the code words having an equal number of redundancy symbols.

In another aspect of the present invention the choosing step includes choosing filling symbols that are zeros.

In another aspect of the present invention the choosing step includes constructing the symbol group of a predefined length z by selecting x of the data symbols in accordance with a predefined data symbol transmission rate and inserting $y=z-x$ of the filler symbols.

In another aspect of the present invention the choosing step includes appending the selected filler symbols to the selected data symbols.

In another aspect of the present invention the choosing step includes prepending the selected filler symbols to the selected data symbols.

In another aspect of the present invention the encoding step includes encoding using systematic Reed-Solomon (RS) encoding.

In another aspect of the present invention the removing step includes removing a different number of filler symbols from each of a plurality of the code words.

In another aspect of the present invention the removing step includes removing any of the filler symbols whose locations are indicated by the selector.

In another aspect of the present invention the removing step includes removing any of the redundancy symbols from the code word.

In another aspect of the present invention the removing step includes removing a different number of redundancy symbols from each of a plurality of the code words.

In another aspect of the present invention a forward error correction decoding method is provided including choosing either of data symbols from a data stream and filler symbols, thereby forming a symbol group therefrom, decoding the symbol group into a decoded symbol group, and removing from the decoded symbol group any of the filler symbols.

In another aspect of the present invention the choosing step includes forming a plurality of symbol groups of equal lengths, where at least two of the symbol groups have a different number of data symbols.

In another aspect of the present invention the decoding step includes receiving a plurality of symbol groups of equal lengths, where at least two of the symbol groups have a different number of data symbols.

In another aspect of the present invention the choosing step includes choosing filling symbols that are zeros.

In another aspect of the present invention the choosing step includes constructing the symbol group of a predefined length z by selecting x of the data symbols in accordance with a predefined data symbol transmission rate and inserting $y=z-x$ of the filler symbols.

In another aspect of the present invention the choosing step includes appending the selected filler symbols to the selected data symbols.

In another aspect of the present invention the choosing step includes prepending the selected filler symbols to the selected data symbols.

In another aspect of the present invention the choosing step includes selecting for inclusion in the symbol group a number of the filler symbols corresponding to a number of filler symbols previously removed from the data stream.

In another aspect of the present invention the choosing step includes selecting for inclusion in the symbol group a number of the filler symbols corresponding to a number of redundancy symbols previously removed from the data stream.

In another aspect of the present invention the decoding step includes decoding using systematic Reed-Solomon (RS) decoding.

In another aspect of the present invention the removing step includes removing a different number of filler symbols each of a plurality of the decoded symbol groups.

In another aspect of the present invention the removing step includes removing any of the filler symbols whose locations are indicated by the selector.

In another aspect of the present invention the method further includes designating any of the data symbols as erasures.

In another aspect of the present invention a forward error correction encoding and decoding method is provided including firstly choosing either of data symbols and filler symbols, thereby forming a first symbol group therefrom, encoding the first symbol group into a code word having at least one redundancy symbol, firstly removing from the code word any of the filler symbols, secondly choosing either of data symbols from the code words and filler symbols from the filling buffer, thereby forming a second symbol group therefrom, decoding the second symbol group into a decoded symbol group, and secondly removing from the decoded symbol group any of the filler symbols.

In another aspect of the present invention either of the choosing steps includes forming a plurality of symbol groups of equal lengths, where at least two of the symbol groups have a different number of data symbols.

In another aspect of the present invention the encoding step includes receiving a plurality of first selector symbol groups of equal lengths, where at least two of the symbol groups have a different number of data symbols, and encoding the plurality of symbol groups into a corresponding plurality of code words of equal length using a single code, each of the code words having an equal number of redundancy symbols.

In another aspect of the present invention either of the choosing steps includes choosing filling symbols that are zeros.

In another aspect of the present invention either of the choosing steps includes constructing either of the symbol groups of a predefined length z by selecting x of the data symbols in accordance with a predefined data symbol transmission rate and inserting y=z−x of the filler symbols.

In another aspect of the present invention either of the choosing steps includes appending the selected filler symbols to the selected data symbols.

In another aspect of the present invention either of the choosing steps includes prepending the selected filler symbols to the selected data symbols.

In another aspect of the present invention the encoding step includes encoding using systematic Reed-Solomon (RS) encoding.

In another aspect of the present invention the first removing step includes removing a different number of filler symbols from each of a plurality of the code words.

In another aspect of the present invention the first removing step includes removing any of the filler symbols whose locations are indicated by the selector.

In another aspect of the present invention the first removing step includes removing any of the redundancy symbols from the code word.

In another aspect of the present invention the first removing step includes removing a different number of redundancy symbols from each of a plurality of the code words.

In another aspect of the present invention the decoding step includes receiving a plurality of symbol groups of equal lengths, where at least two of the symbol groups have a different number of data symbols.

In another aspect of the present invention the secondly choosing step includes selecting for inclusion in the symbol group a number of the filler symbols corresponding to a number of filler symbols previously removed from the data stream.

In another aspect of the present invention the secondly choosing step includes selecting for inclusion in the symbol group a number of the filler symbols corresponding to a number of redundancy symbols previously removed from the data stream.

In another aspect of the present invention the decoding step includes decoding using systematic Reed-Solomon (RS) decoding.

In another aspect of the present invention the secondly removing step includes removing a different number of filler symbols each of a plurality of the decoded symbol groups.

In another aspect of the present invention the secondly removing step includes removing any of the filler symbols whose locations are indicated by the selector.

In another aspect of the present invention the method further includes designating any of the data symbols as erasures.

In another aspect of the present invention a forward error correction method is provided including inserting at least one filler symbol into an input data stream at a predetermined position, thereby generating a precoded symbol group, FEC encoding the precoded symbol group, thereby generating a code word, removing at least one of the filler symbols from the code word, thereby generating an optimized code word, inserting at least one filler symbol into the optimized code word at the predetermined position, thereby generating a deoptimized code word, FEC decoding the deoptimized code word, thereby generating a decoded symbol group, and removing at least one of the filler symbols from the decoded symbol group, thereby generating an output data stream.

In another aspect of the present invention the method further includes transmitting the optimized code word to a receiver subsequent to the first removing step and prior to the second inserting step.

In another aspect of the present invention the first inserting step includes generating a plurality of precoded symbol groups of equal length where at least two of the precoded symbol groups have a different number of data symbols, and where the FEC encoding step includes encoding with a single code at least two of the precoded symbol groups having a different number of data symbols into a corresponding plurality of code words of equal length, each of the code words having an equal number of redundancy symbols.

In another aspect of the present invention the second inserting step includes generating a plurality of deoptimized code words of equal length where at least two of the deoptimized code words have a different number of data symbols, and where the FEC decoding step includes decoding with a single code at least two of the deoptimized code words having a different number of data symbols.

In another aspect of the present invention the first removing step includes removing any of the redundancy symbols from the code word.

BRIEF DESCRIPTION OF THE DRAWINGS

The present invention will be understood and appreciated more fully from the following detailed description taken in conjunction with the appended drawings in which.

DETAILED DESCRIPTION OF PREFERRED EMBODIMENTS

Figure 1:
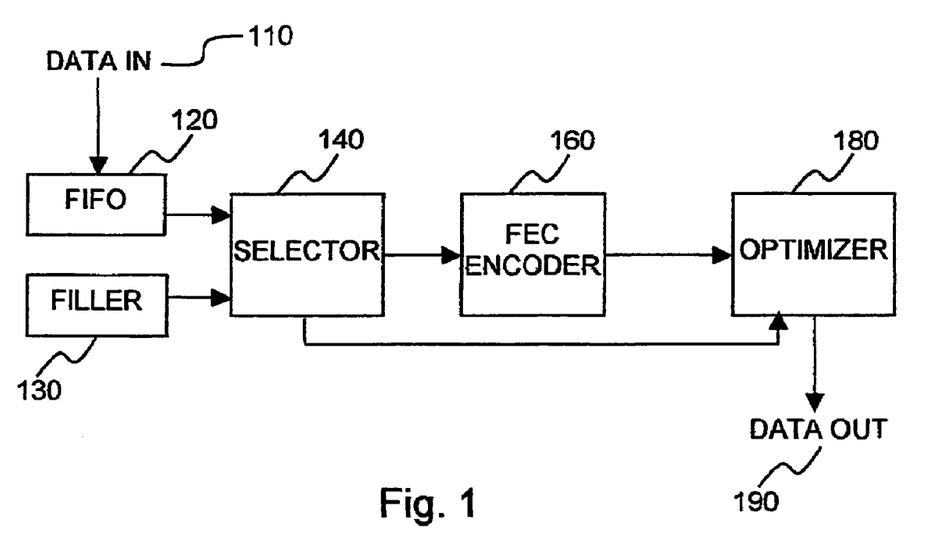
FIG. 1 is a simplified block-flow diagram of a forward error correction encoding system, constructed and operative in accordance with a preferred embodiment of the present invention.

Reference is now made to FIG. 1, which is a simplified block-flow diagram of a forward error correction encoding system, constructed and operative in accordance with a preferred embodiment of the present invention. In the system of FIG. 1 a FIFO buffer 120 receives data from a data stream 110. A selector 140 chooses either data from the FIFO buffer 120 or filler symbols from a filling buffer 130. Selector 140 is preferably configured to construct symbol groups of a predefined length z by selecting x data symbols in accordance with predefined data symbol transmission rate and inserting, such as by prepending or appending, $y=z-x$ filler symbols. A FEC encoder 160, such as a systematic Reed-Solomon (RS) encoder, receives the data and encodes it. The encoded data is then input to an optimizer 180 which removes the filler symbols introduced from filling buffer 130, with the locations of the filler symbols indicated by selector 140. Optimizer 180 may also remove one or more redundancy data symbols from the encoded data which were added by the FEC encoder 160. The optimized data are then transmitted over a channel and received at the other end of the channel by a decoding system, such as that which is described hereinbelow with reference to FIG. 2.

It is appreciated that filling buffer 130 may use zeros or any other filler symbols as long as they are known in advance to the decoding system as such. The description herein in terms of zero filler symbols is provided by way of example only.

Figure 2:
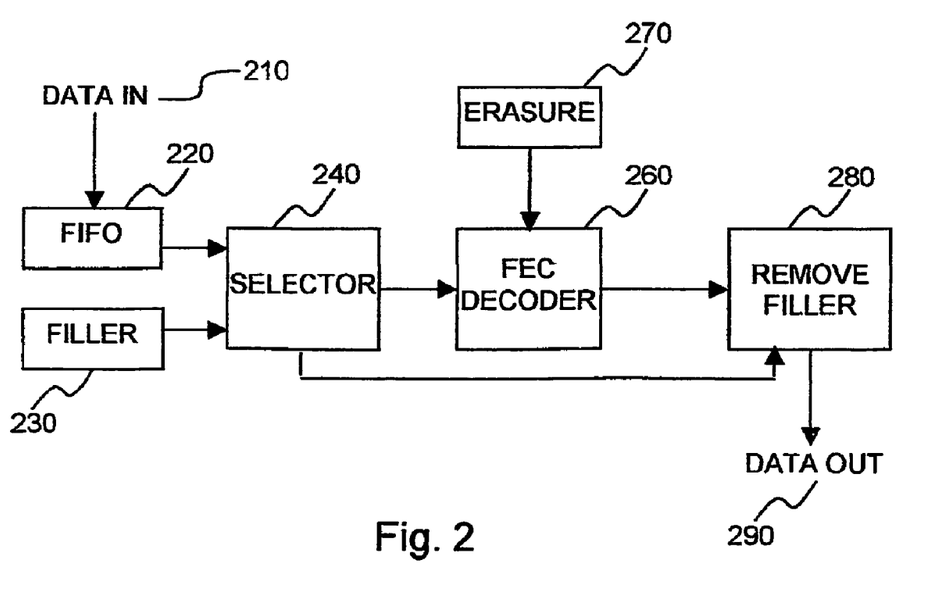
FIG. 2 is a simplified block-flow diagram of a forward error correction decoding system, constructed and operative in accordance with a preferred embodiment of the present invention.

Reference is now made to FIG. 2, which is a simplified block-flow diagram of a forward error correction decoding system, constructed and operative in accordance with a preferred embodiment of the present invention. In the system of FIG. 2 a FIFO buffer 220 receives data from a data stream 210. A selector 240 chooses either data from either a FIFO buffer 220 or filler symbols from a filling buffer 230. Selector 240 is configured in the same fashion as selector 140 (FIG. 1) to know where to insert filler symbols into received data streams, and is also configured to know where optimizer 180 has removed redundancy symbols which may then be designated as erasures. A FEC decoder 260 receives the data, and an erasure element 270 designates any of the received data symbols as erasures, with the locations of the filler symbols indicated by selector 240. The FEC decoder 260 decodes the received data stream, with the decoded data containing both the information from the original encoded data stream and the added filler symbols. The decoded data is then input into remove filling element 280 which removes the filler symbols from the decoded data, thus generating an output data stream 290 which is a replica of the original data stream, provided the number of errors introduced by the channel is less than the error correction capability of the FEC decoder 260.

The operation of selector 240 is slightly different than that of selector 140 described in FIG. 1. Selector 240 adds filler symbols in all places where selector 140 added zeros, and in addition adds filler symbols at all places where the FEC encoder generated a redundancy data symbol which was removed by optimizer 180 and not transmitted over the channel. As noted above, zeros or other filler symbols may be added as data symbols by filling buffer 130 provided that the type of filler symbols used are known in advance to the FEC decoder which designates them as known data symbols, while the filler symbols added by filling element 230 in place of redundancy symbols need not be the same filler symbols, provided that they are understood by the decoder as erasures.

Figure 3:
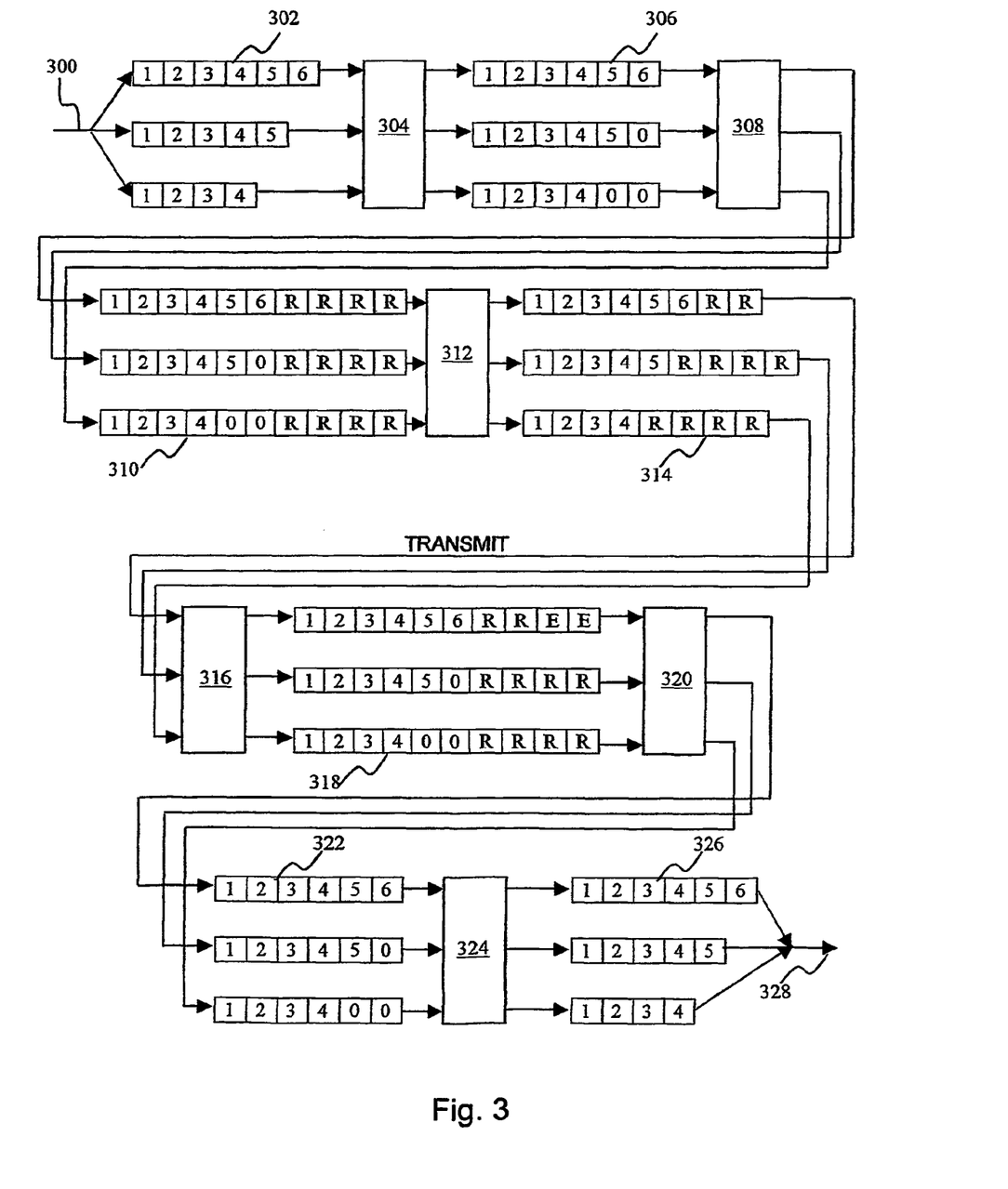
FIG. 3 is a simplified block-flow diagram of an exemplary method of point-to-point operation of the forward error correction systems of FIGS. 1 and 2, operative in accordance with a preferred embodiment of the present invention.

Reference is now made to FIG. 3, which is a simplified block-flow diagram of an exemplary method of point-to-point operation of the forward error correction systems of FIGS. 1 and 2, operative in accordance with a preferred embodiment of the present invention. In FIG. 3 a single FEC encoder is employed for three different channels, each having different encoding requirements due to different qualities of the channels. The first channel is a high quality channel which requires only 25% added redundancy and has the ability to transmit eight data symbols in a given time frame. The second channel is of lower quality but slightly higher bandwidth, and is thus able to transmit nine data symbols in the same time frame, but requires a greater level of redundancy such that four of every nine data symbols are redundancy symbols. The third channel requires 50% redundancy and transmits eight data symbols in the same time frame. The encoder configuration shown generates code words that are ten symbols in length, including six information symbols and four redundancy symbols. In FIG. 3 a data stream 300 is input. Out of every fifteen data symbols in data stream 300, the first six are for the first channel, the next five for the second channel, and the next four are for the third channel. Data stream 300 is thus separated into three data streams 302. Symbol groups from each of the data streams 302 are then constructed at 304 where predefined filler symbols, such as zeros, are added to each symbol group to generate precoded symbol groups 306. Precoded symbol groups 306 are then FEC encoded at 308 using a single code to generate code words 310. Code words 310 are then optimized at 312 where the filler data symbols and any redundancy data symbols R not required for the channel (i.e., excess redundancy symbols) are removed from each of the code words 310 to generate optimized code words 314. Each of the optimized code words 314 is then transmitted over a different channel and received at the other end of the channel. At 316, predefined filler data symbols, such as zeros, are inserted back into the received code words 314 at the positions from which they were removed at 312, and redundancy symbols that were removed prior to transmission are designated as erasures E, thus forming deoptimized code words 318. The deoptimized code words 318 are then FEC decoded at 320 using a single code, to produce decoded symbol groups 322. Any of the filler symbols in decoded symbol groups 322 are then removed at 324 to generate output data streams 326, which are reconstructions of input data streams 302, and which may be recombined to reconstruct input data stream 300.

Figure 4:
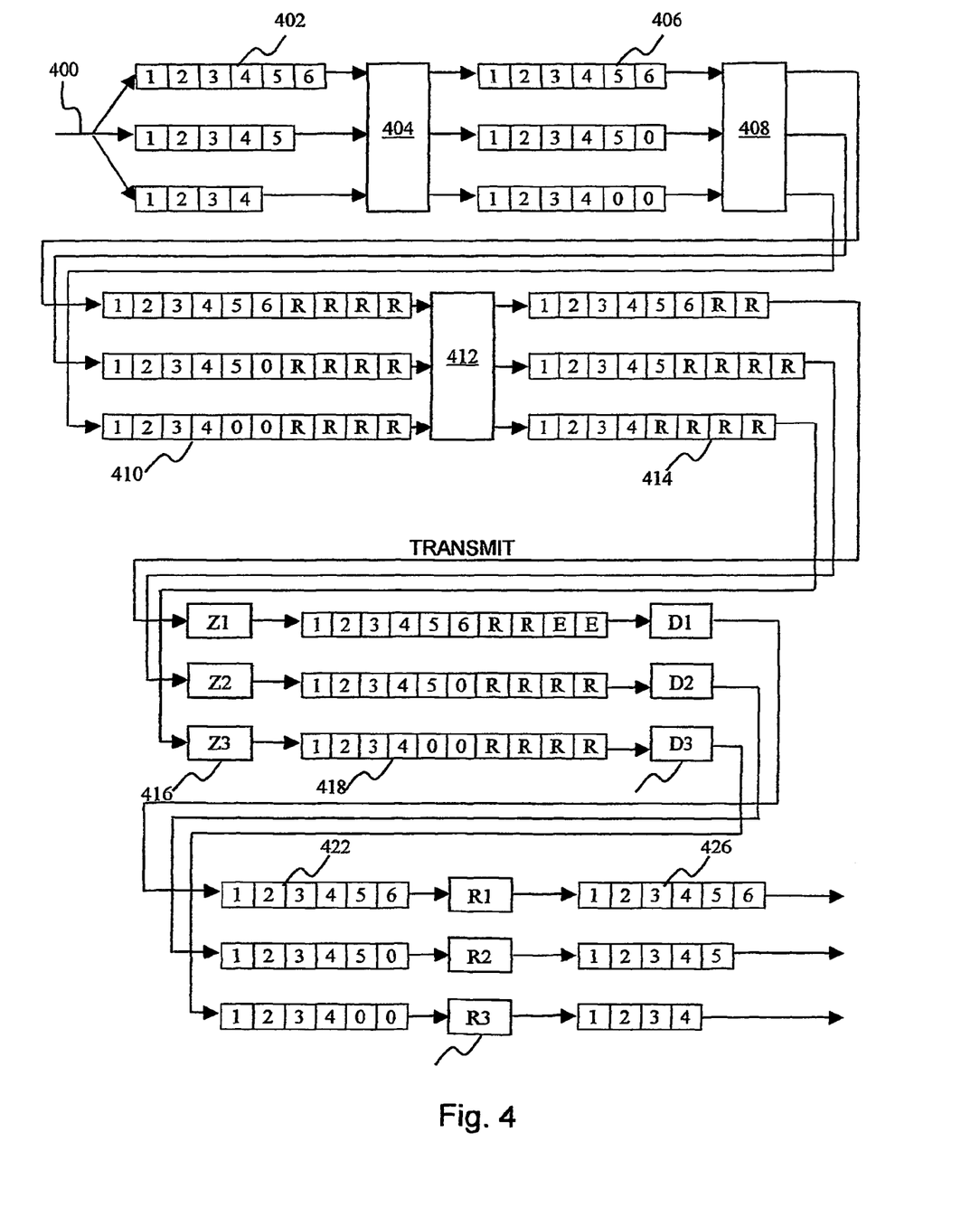
FIG. 4 is a simplified block-flow diagram of an exemplary method of point-to-multipoint operation of the forward error correction systems of FIGS. 1 and 2, operative in accordance with a preferred embodiment of the present invention.

Reference is now made to FIG. 4, which is a simplified block-flow diagram of an exemplary method of point-to-multipoint operation of the forward error correction systems of FIGS. 1 and 2, operative in accordance with a preferred embodiment of the present invention. The method of FIG. 4 is substantially similar to the method of FIG. 3 with the notable exception that processing of optimized code words 414 after transmission is performed separately for each received channel, such as where the transmissions are received at different physical locations. Thus in FIG. 4, at 416, predefined filler data symbols, such as zeros, are inserted back into the received code words 414 separately for each channel, at Z1, Z2, and Z3. FEC decoding at 420 is likewise performed separately for each channel, at D1, D2, and D3, as is the removal of filler symbols at 424 performed separately for each channel, at R1, R2, and R to generate output data streams 426, which are reconstructions of input data streams 402.

Figure 5:
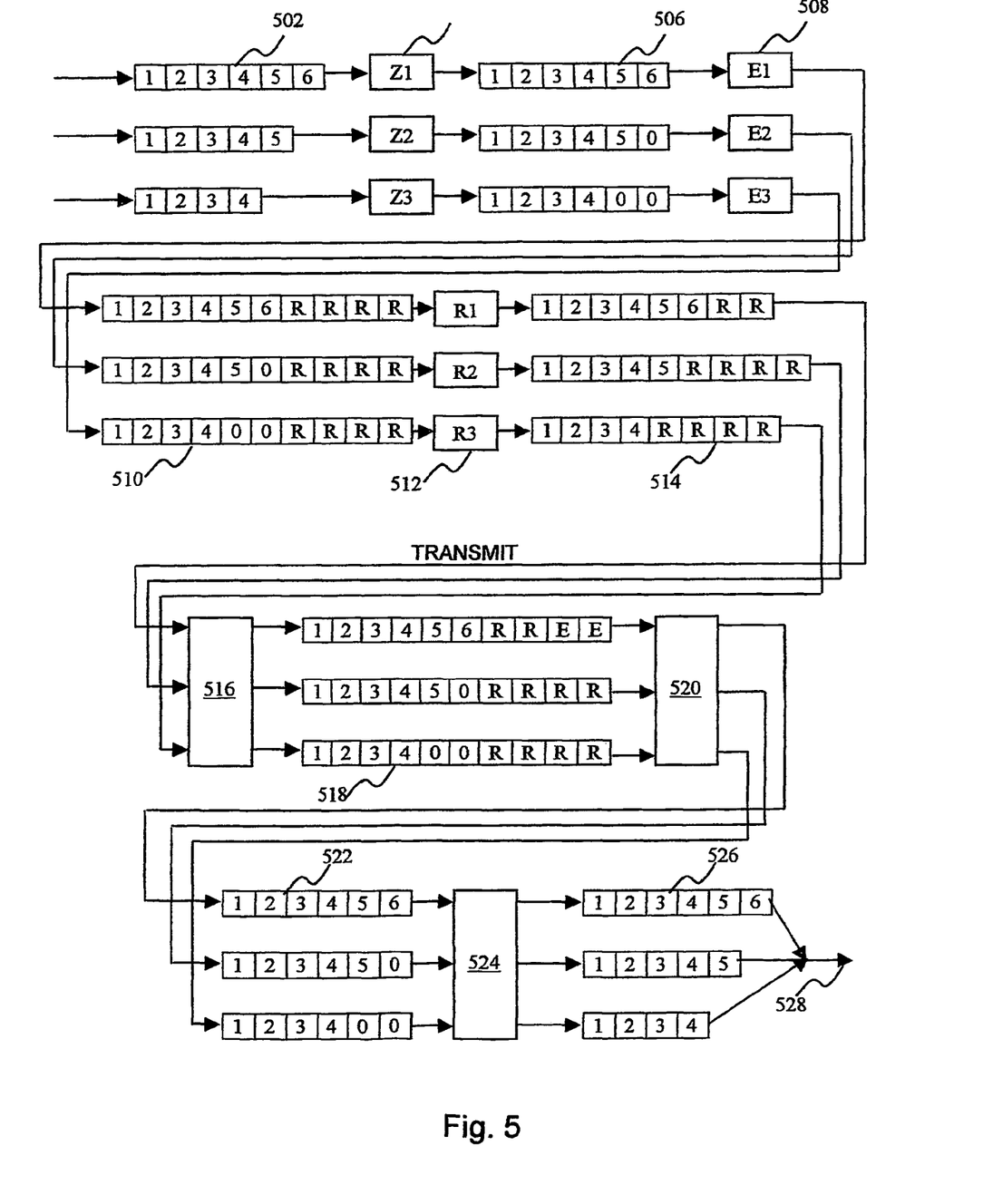
FIG. 5 is a simplified block-flow diagram of an exemplary method of mutlipoint-to-point operation of the forward error correction systems of FIGS. 1 and 2, operative in accordance with a preferred embodiment of the present invention.

Reference is now made to FIG. 5, which is a simplified block-flow diagram of an exemplary method of multipointto-point operation of the forward error correction systems of FIGS. 1 and 2, operative in accordance with a preferred embodiment of the present invention. The method of FIG. 5 is substantially similar to the method of FIG. 3 with the notable exception that processing prior to transmission is performed separately for each channel, such as where the transmissions are transmitted from different physical locations. Thus in FIG. 5, at 504, predefined filler data symbols, such as zeros, are inserted into the symbol groups of each of the data streams 502 separately for each channel, at Z1, Z2, and Z3. FEC encoding at 506 is likewise performed separately for each channel, at D1, D2, and D3, as is the removal of filler symbols and redundancy symbols at 524 performed separately for each channel, at R1, R2, and R to generate optimized code words 512.

Preferably, the systems and methods described herein employ a systematic FEC that uses erasure information to achieve better decoding. A systematic Reed-Solomon FEC is one example of such a FEC.

It is appreciated that one or more of the steps of any of the methods described herein may be omitted or carried out in a different order than that shown, without departing from the true spirit and scope of the invention.

While the methods and apparatus disclosed herein may or may not have been described with reference to specific computer hardware or software, it is appreciated that the methods and apparatus described herein may be readily implemented in computer hardware or software using conventional techniques.

While the present invention has been described with reference to one or more specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

I claim:

1. A forward error correction encoding system comprising:
   a FIFO buffer operative to provide data symbols received from a data stream corresponding to a plurality of communication channels;
   a filling buffer operative to provide filler symbols;
   a selector operative to choose data symbols from said FIFO buffer and optionally a variable number of filler symbols from said filling buffer and form a symbol group therefrom, wherein said selector is operative to form a plurality of symbol groups of equal lengths each corresponding to a respective communication channel, at least two of said symbol groups having a different number of data symbols;
   a FEC encoder operative to encode each of said symbol groups into a code word having at least one redundancy symbol; and
   an optimizer operative to remove from said code word any of said filler symbols.

2. A system according to claim 1 wherein each of said FEC encoders is operative to receive a plurality of symbol groups of equal lengths, wherein at least two of said symbol groups have a different number of data symbols, and encode said plurality of symbol groups into a corresponding plurality of code words of equal length using a single code, each of said code words having an equal number of redundancy symbols.

3. A system according to claim 1 wherein said filling symbols are zeros.

4. A system according to claim 1 wherein said selector is operative to construct said symbol group of a predefined length z by selecting x of said data symbols in accordance with a predefined data symbol transmission rate and inserting y=z−x of said filler symbols.

5. A system according to claim 4 wherein said selector is operative to append said selected filler symbols to said selected data symbols.

6. A system according to claim 4 wherein said selector is operative to prepend said selected filler symbols to said selected data symbols.

7. A system according to claim 1 wherein said FEC encoder comprises A systematic Reed-Solomon (RS) encoder.

8. A system according to claim 1 wherein said optimizer is operative to remove a different number of filler symbols from each of a plurality of said code words.

9. A system according to claim 1 wherein said optimizer is operative to remove any of said filler symbols whose locations are indicated by said selector.

10. A system according to claim 1 wherein said optimizer is operative to remove any of said redundancy symbols from said code word.

11. A system according to claim 10 wherein said optimizer is operative to remove a different number of redundancy symbols from each of a plurality of said code words.

12. A forward error correction decoding system comprising:
    a FIFO buffer operative to provide data symbols received from a data stream corresponding to a plurality of communication channels;
    a filling buffer operative to provide filling symbols;
    a selector operative to choose data symbols from said FIFO buffer and optionally a variable number of filler symbols from said filling buffer and form a symbol group therefrom, wherein said selector is operative to form a plurality of symbol groups of equal lengths each corresponding to a respective communication channel, at least two of said symbol groups having a different number of data symbols;
    a FEC decoder operative to decode each of said symbol groups into a decoded symbol group; and
    a filler remover operative to remove from said decoded symbol group any of said filler symbols.

13. A system according to claim 12 wherein each of said FEC decoders is operative to receive a plurality of symbol groups of equal lengths, wherein at least two of said symbol groups have a different number of data symbols.

14. A system according to claim 12 wherein said filling symbols are zeros.

15. A system according to claim 12 wherein said selector is operative to construct said symbol group of a predefined length z by selecting x of said data symbols in accordance with a predefined data symbol transmission rate and inserting y=z−x of said filler symbols.

16. A system according to claim 15 wherein said selector is operative to append said selected filler symbols to said selected data symbols.

17. A system according to claim 15 wherein said selector is operative to prepend said selected filler symbols to said selected data symbols.

18. A system according to claim 15 wherein said selector is operative to select for inclusion in said symbol group a number of said filler symbols corresponding to a number of filler symbols previously removed from said data stream.

* * * * *